(12) United States Patent
Huang

(10) Patent No.: US 12,237,326 B2
(45) Date of Patent: Feb. 25, 2025

(54) FINGER-TYPE SEMICONDUCTOR CAPACITOR ARRAY LAYOUT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 554 days.

(21) Appl. No.: 17/676,852

(22) Filed: Feb. 22, 2022

(65) Prior Publication Data

US 2022/0367447 A1    Nov. 17, 2022

(30) Foreign Application Priority Data

May 11, 2021    (TW) ................................. 110116895

(51) Int. Cl.
*H01L 27/08* (2006.01)
*H01L 23/522* (2006.01)
*H01L 49/02* (2006.01)

(52) U.S. Cl.
CPC ...... *H01L 27/0805* (2013.01); *H01L 23/5223* (2013.01); *H01L 28/40* (2013.01)

(58) Field of Classification Search
CPC .. H01L 27/0805; H01L 23/5223; H01L 28/40
See application file for complete search history.

(56) References Cited

U.S. PATENT DOCUMENTS

2006/0270145 A1* 11/2006 Bach ................... H01L 27/0805
257/296

* cited by examiner

*Primary Examiner* — Peter M Albrecht
(74) *Attorney, Agent, or Firm* — WPAT, PC

(57) ABSTRACT

A finger-type semiconductor capacitor array layout includes a first conductive structure and a second conductive structure. The first conductive structure includes longitudinal first conductive strips and lateral power supply strips. The second conductive structure includes longitudinal second conductive strips and P lateral power supply strip(s). The longitudinal first conductive strips and the longitudinal second conductive strips are alternately disposed in a first integrated circuit (IC) layer; and the longitudinal first conductive strips include a first row of strips and a second row of strips. The lateral power supply strips are located in a second IC layer, and coupled to the first and second rows of strips through vias. The P lateral power supply strip(s) is/are located in the second IC layer, and include(s) a first-capacitor-group power supply strip that is coupled to K strip(s) of the longitudinal second conductive strips through K via(s). The P and K are positive integers.

15 Claims, 3 Drawing Sheets

FINGER-TYPE SEMICONDUCTOR CAPACITOR ARRAY LAYOUT

BACKGROUND OF THE INVENTION

1. Field of the Invention

The present disclosure relates to a semiconductor capacitor array layout, especially to a finger-type semiconductor capacitor array layout.

2. Description of Related Art

A general semiconductor integrated circuit is in the form of a multilayer structure. A conventional semiconductor capacitor array is usually located in a single metal layer of the multilayer structure. The semiconductor capacitor array usually includes multiple rows of capacitor units that are arranged in parallel and include a first row of capacitor units (hereafter referred to as "first capacitor row") and a second row of capacitor units (hereafter referred to as "second capacitor row"). In order to avoid an upper electrode (lower electrode) of the first capacitor row and the trace of a lower electrode (upper electrode) of the second capacitor row jointly forming parasitic capacitance having influence on the accuracy of capacitance of the capacitor units, the gap between the first capacitor row and the second capacitor row needs to be broaden; however, this wastes circuit area. In regard to the above case, the upper electrode (lower electrode) of the first capacitor row is parallel to the trace of the lower electrode (upper electrode) of the second capacitor row and thereby contributes additional capacitance, and this affects the accuracy of capacitance of the capacitor units.

There are other problems with respect to a conventional semiconductor capacitor array. The design of a capacitor unit of some conventional semiconductor capacitor array is shown in FIG. 1a. In FIG. 1a, the upper electrode 110 is in the form of a U-shaped structure including two longitudinal parts and one lateral part, the lower electrode 120 is in the form of a strip-shaped structure. In comparison with a general mature process, in some advanced process (e.g., Fin Field-Effect Transistor (FinFET) process) the ratio (W/L) of the width "W" of the lateral part of the U-shaped structure to the length "L" of the longitudinal part of the U-shaped structure should be larger as shown in FIG. 1b to conform to the specification of the advanced process. Since a semiconductor capacitor array usually includes a large amount of capacitor units, once the ratio (W/L) of the U-shaped structure of every capacitor unit is enlarged, the overall semiconductor capacitor array will consume a lot of additional circuit area. It should be noted that FIGS. 1a-1b shows the variation in the ratio (W/L) of the U-shaped structure rather than the actual size of the U-shaped structure.

SUMMARY OF THE INVENTION

An object of the present disclosure is to provide a finger-type semiconductor capacitor array layout as an improvement over the prior art.

An embodiment of the finger-type semiconductor capacitor array layout of the present disclosure includes a first conductive structure and a second conductive structure. The first conductive structure includes a plurality of longitudinal first conductive strips and a plurality of lateral power supply strips. The second conductive structure includes a plurality of longitudinal second conductive strips and P lateral power supply strip(s), wherein the P is a positive integer.

In the above-mentioned embodiment, the longitudinal first conductive strips are located in a first integrated circuit (IC) layer and include M first-row first conductive strips and M second-row first conductive strips, wherein the M is an integer greater than one. The M first-row first conductive strips are spaced at intervals and thereby form (M-1) first gap(s). The M second-row first conductive strips are spaced at intervals and thereby form (M-1) second gap(s). The lateral power supply strips are located in a second IC layer and used for the transmission of a first reference voltage, and the lateral power supply strips include a first power supply strip and a second power supply strip. The first power supply strip is coupled with the M first-row first conductive strips through M first-row vias respectively. The second power supply strip is coupled with the M second-row first conductive strips through M second-row vias respectively.

In the aforementioned embodiment, the longitudinal second conductive strips are located in the first IC layer and include (M-1) second conductive strip(s). Each of the (M-1) second conductive strip(s) includes a first part and a second part that are coupled together; accordingly, the (M-1) second conductive strip(s) include(s) (M-1) first part(s) and (M-1) second part(s). The (M-1) first part(s) is/are located in the (M-1) first gap(s) and electrically insulated from the M first-row first conductive strips to form (M-1) capacitor unit(s). The (M-1) second part(s) is/are located in the (M-1) second gap(s) and electrically insulated from the M second-row first conductive strips to form additional (M-1) capacitor unit(s). The (M-1) second conductive strip(s) is/are used for the transmission of a second reference voltage that is different from the aforementioned first reference voltage. The (M-1) second conductive strip(s) include(s) K second conductive strip(s) pertaining to a first capacitor group among P capacitor group(s) of the finger-type semiconductor capacitor array layout, wherein the K is a positive integer not greater than (M-1), and the P is a positive integer. The P lateral power supply strip(s) is/are located in the second IC layer or a third IC layer, and include(s) a first-capacitor-group power supply strip that is coupled to the K second conductive strip(s) through K via(s).

Another embodiment of the finger-type semiconductor capacitor array layout of the present disclosure includes a first conductive structure and a second conductive structure. The first conductive structure includes longitudinal first conductive strips and lateral power supply strips. The longitudinal first conductive strips are located in a first integrated circuit (IC) layer and include first-row conductive strips and second-row conductive strips. The lateral power supply strips are located in a second IC layer and include a first power supply strip and a second power supply strip. The second conductive structure includes longitudinal second conductive strips and P lateral power supply strip(s), wherein the P is a positive integer. The longitudinal second conductive strips are located in the first IC layer. The P lateral power supply strip(s) is/are located in the second IC layer or a third IC layer. The longitudinal first conductive strips and the longitudinal second conductive strips are alternately disposed in the first IC layer. The first power supply strip is coupled to the first-row conductive strips through first vias respectively; and the second power supply strip is coupled to the second-row conductive strips through second vias respectively. The P lateral power supply strip(s) include(s) a first-capacitor-group power supply strip that is coupled to K second conductive strip(s) of the longitudinal second conductive strips through K third via(s), wherein the K is a positive integer.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The finger-type semiconductor capacitor array layout of the present disclosure can mitigate the problem of parasitic capacitance occurring in the prior art, and can prevent the waste of circuit area caused by the U-shaped structure of the prior art applied in an advanced process.

Figure 2:
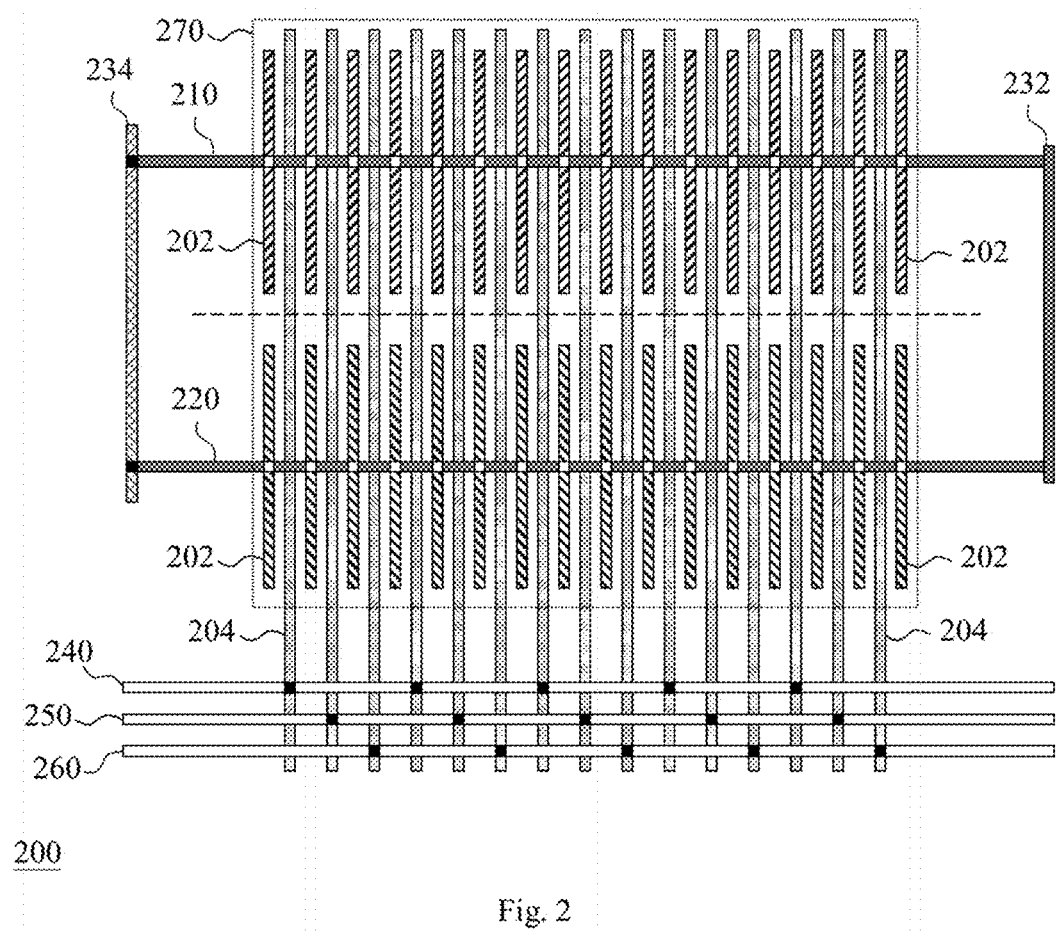
FIG. 2 shows an embodiment of the finger-type semiconductor capacitor array layout of the present disclosure.

FIG. 2 shows an embodiment of the finger-type semiconductor capacitor array layout of the present disclosure. The finger-type semiconductor capacitor array layout 200 of FIG. 2 includes a first conductive structure and a second conductive structure. The first conductive structure includes a plurality of longitudinal first conductive strips 202 (i.e., the upper row of longitudinal strips 202 marked with slashes and the lower row of longitudinal strips 202 marked with backslashes in FIG. 2) and a plurality of lateral power supply strips (i.e., the gray lateral strips 210 and 220 in FIG. 2). The second conductive structure includes a plurality of longitudinal second conductive strips 204 (i.e., the longitudinal strips 204 marked with dots in FIG. 2) and P lateral power supply strip(s) (i.e., the white lateral strips 240, 250, and 260 in FIG. 2), wherein the P is a positive integer.

In the above-mentioned embodiment, the finger-type semiconductor capacitor array layout 200 is included in an integrated circuit (IC) structure (not shown). This IC structure includes a substrate and multiple IC layers formed on/above the substrate. The first conductive structure functions as an upper electrode, and the second conductive structure functions as a lower electrode. It should be noted that the first conductive structure and the second conductive structure may function as a lower electrode and an upper electrode respectively, if practicable.

In regard to the embodiment of FIG. 2, the longitudinal first conductive strips 202 are located in a first IC layer (e.g., the $N^{th}$ metal layer of the aforementioned multiple IC layers, wherein the N is a positive integer) and include M first-row first conductive strips 202 (the longitudinal strips 202 marked with slashes in FIG. 2) and M second-row first conductive strips 202 (i.e., the longitudinal strips 202 marked with backslashes in FIG. 2), wherein the M is an integer greater than one. The central position of any first-row first conductive strip is above the central position of any second-row first conductive strip in the longitudinal direction; for instance, in FIG. 2 the M first-row first conductive strips 202 are located in an upper region in the longitudinal direction while the M second-row first conductive strips 202 are located in a lower region in the longitudinal direction. The M first-row first conductive strips 202 are spaced at intervals and thereby form (M-1) first gap(s). The M second-row first conductive strips 202 are spaced at intervals and thereby form (M-1) second gap(s).

In regard to the embodiment of FIG. 2, the lateral power supply strips (i.e., the gray lateral strips 210 and 220 in FIG. 2) are located in a second IC layer (i.e., the $(N+1)^{th}$ metal layer or the $(N-1)^{th}$ metal layer of the aforementioned multiple IC layers) and used for the transmission of a first reference voltage, and the lateral power supply strips include a first power supply strip 210 and a second power supply strip 220. The first power supply strip 210 is coupled with the M first-row first conductive strips 202 through M first-row vias (i.e., the white blocks coupling the first power supply strip 210 with the longitudinal strips 202 marked with slashes in FIG. 2) respectively. The second power supply strip 220 is coupled with the M second-row first conductive strips 202 through M second-row vias (i.e., the white blocks coupling the second power supply strip 220 with the longitudinal strips 202 marked with backslashes in FIG. 2) respectively.

It should be noted that as shown in FIG. 2, the first power supply strip 210 can be coupled with the second power supply strip 220 through at least one conductive strip (e.g., the conductive strips 232 and 234 in FIG. 2). If the at least one conductive strip is located in an IC layer different from the second IC layer, the at least one conductive strip can be coupled to the first power supply strip 210 and the second power supply strip 220 through vias (i.e., the black blocks coupling the conductive strip 234 with the first power supply strip 210 and the second power supply strip 220 in FIG. 2). According to the demand for implementation, at least a part of the at least one conductive strip can be omitted or replaced by another known/self-developed means. It should also be noted that the first IC layer and the second IC layer are a first metal layer and a second metal layer of the aforementioned multiple IC layers respectively in the embodiment of FIG. 2, and no other metal layer is between the first metal layer and the second metal layer; however, the present invention is not limited thereto.

In regard to the embodiment of FIG. 2, the longitudinal second conductive strips 204 (i.e., the longitudinal strips 204 marked with dots in FIG. 2) are located in the first IC layer and include (M-1) second conductive strip(s) 204. Each of the (M-1) second conductive strip(s) 204 includes a first part (e.g., the part above the dashed line in FIG. 2) and a second part (e.g., the part below the dashed line in FIG. 2) that are coupled together; accordingly, the (M-1) second conductive strip(s) 204 include(s) (M-1) first part(s) and (M-1) second part(s). The (M-1) first part(s) is/are located in the aforementioned (M-1) first gap(s) and electrically insulated from the M first-row first conductive strips 202 by dielectric such as oxide (not shown in FIG. 2) to form (M-1) capacitor unit(s). The (M-1) second part(s) is/are located in the (M-1) second gap(s) and electrically insulated from the M second-row first conductive strips 202 to form additional (M-1) capacitor unit(s). The (M-1) second conductive strip(s) 204 is/are used for the transmission of a second reference voltage that is different from the aforementioned first reference voltage. In FIG. 2, each of the (M-1) capacitor unit(s) and the additional (M-1) capacitor unit(s) (i.e., each of the (2M-2) capacitor units) is the minimum capacitor unit of the finger-type semiconductor capacitor array layout 200, but the present invention is not limited thereto.

Please refer to FIG. 2. It should be noted that the length of each of the (M-1) second conductive strip(s) 204 is longer than the length of each of the M first-row first conductive strips 202 and also longer than the length of each of the M second-row first conductive strips 202. For example, the length of each of the (M-1) second conductive strip(s) 204 is longer than two times the length of each of the M first-row first conductive strips 202 and also longer than two times the length of each of the M second-row first conductive strips 202.

In regard to the embodiment of FIG. 2, the aforementioned (M-1) second conductive strip(s) 204 is/are used for the transmission of a second reference voltage that is different from the aforementioned first reference voltage. The (M-1) second conductive strip(s) 204 include(s) K second conductive strip(s) 204 (e.g., the five longitudinal strips 204 coupled to the power supply strip 240 in FIG. 2) pertaining to a first capacitor group among P capacitor group(s) of the finger-type semiconductor capacitor array layout 200, wherein the first capacitor group includes 2K capacitor units of the aforementioned (2M-2) capacitor units, the K is a positive integer not greater than (M-1), and the P is a positive integer. In brief, the capacitor units coupled to the K second conductive strip(s) 204 belong to the same capacitor group which can be treated as a larger capacitor. In addition, the aforementioned P lateral power supply strip(s) is/are located in the second IC layer or a third IC layer (e.g., the $(N-1)^{th}$ metal layer while the second IC layer is the $(N+1)^{th}$ metal layer), and include(s) a first-capacitor-group power supply strip (e.g., the power supply strip 240 in FIG. 2) that is coupled to the K second conductive strip(s) 204 through K via(s).

People having ordinary skill in the art can appreciate an embodiment that the P capacitor group(s) include(s) two or more capacitor groups according to the above description. For example, the M is greater than three, the P is greater than two, and the P capacitor groups further include a second capacitor group and a third capacitor group. The (M-1) second conductive strips 204 include L second conductive strip(s) 204 (e.g., the five longitudinal strips 204 coupled to the power supply strip 250 in FIG. 2) pertaining to the second capacitor group, and the (M-1) second conductive strips 204 include J second conductive strip(s) 204 (e.g., the five longitudinal strips 204 coupled to the power supply strip 260 in FIG. 2) pertaining to the third capacitor group. The second capacitor group includes 2L capacitor units of the aforementioned (2M-2) capacitor units, and the third capacitor group includes 2J capacitor units of the aforementioned (2M-2) capacitor units. Both the L and the J are positive integers. The P lateral power supply strips include a second-capacitor-group power supply strip (e.g., the power supply strip 250 in FIG. 2) and a third-capacitor-group power supply strip (e.g., the power supply strip 260 in FIG. 2). The second-capacitor-group power supply strip is coupled to the L second conductive strip(s) 204 through L via(s), and the third-capacitor-group power supply strip is coupled to the J second conductive strip(s) 204 through J via(s); in this case, the sum of the K, the L, and the J is not greater than (M-1). It should be noted that any two of the K, the L, and the J can be the same or different.

In regard to the embodiment of FIG. 2, the longitudinal first conductive strips 202 are parallel in a first direction, the lateral power supply strips (i.e., the gray lateral strips 210 and 220 in FIG. 2) are parallel in a second direction, the longitudinal second conductive strips 204 are parallel in the first direction, the P lateral power supply strips (i.e., the white lateral strips 240, 250, and 260 in FIG. 2) are parallel in the second direction providing the P is greater than one, and the first direction is perpendicular to the second direction; however, the implementation of the present invention is not limited to the above features. In addition, the longitudinal first conductive strips 202 and the longitudinal second conductive strips 204 are located in a layout region 270 of the first IC layer, and no conductive strip in the layout region 270 is disposed in the second direction; however, the implementation of the present invention is not limited to the above features.

Figure 1A:
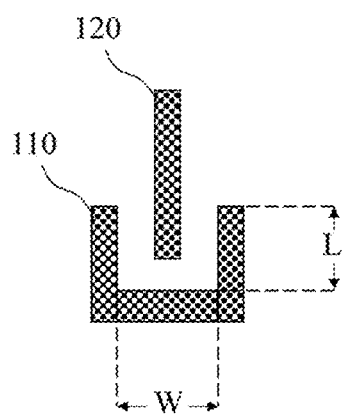
FIG. 1a shows the design of a capacitor unit according to the prior art.
Figure 1B:
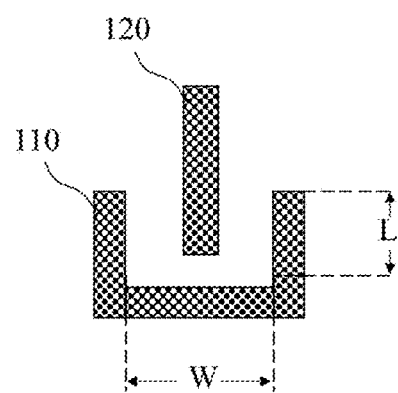
FIG. 1b shows how the design of the capacitor unit in FIG. 1a is modified to conform to the specification of an advanced process.

On the basis of the above description, since the capacitor units of the finger-type semiconductor capacitor array layout 200 of FIG. 2 are formed within the layout region 270 and all the conductive strips in the layout region 270 are in the longitudinal direction, these capacitor units without U-shaped structures can have a good layout without the waste of circuit area when they are fabricated with a process conforming to the specification of an advanced process (e.g., Fin Field-Effect Transistor (FinFET) process). For example, the aspect ratio (W/L) of the U-shaped structure in FIG. 1b under the specification of the FinFET process is larger than the aspect ratio of the U-shaped structure in FIG. 1a under the specification of a general mature process; however, the capacitor units of the finger-type semiconductor capacitor array layout 200 are not in the form of U-shaped structures and thus the layout 200 doesn't need to waste circuit area under the specification of an advanced process.

Another embodiment of the finger-type semiconductor capacitor array layout of the present disclosure includes a first conductive structure and a second conductive structure. The first conductive structure includes longitudinal first conductive strips and lateral power supply strips. The longitudinal first conductive strips are located in a first integrated circuit (IC) layer and include a first row of conductive strips and a second row of conductive strips. The lateral power supply strips are located in a second IC layer and include a first power supply strip and a second power supply strip. The first power supply strip is coupled to the first row of conductive strips through first vias, and the second power supply strip is coupled to the second row of conductive strips through second vias. The second conductive structure includes longitudinal second conductive strips and P lateral power supply strip(s), wherein the P is a positive integer. The longitudinal second conductive strips are located in the first IC layer. The P lateral power supply strip(s) is/are located in the second IC layer or a third IC layer. The P lateral power supply strip(s) include(s) a first-capacitor-group power supply strip coupled to at least a part of the longitudinal second conductive strips through at least one third via. The longitudinal first conductive strips and the longitudinal second conductive strips are alternately disposed in the first IC layer. Accordingly, between two adjacent longitudinal first conductive strips lies one longitudinal second conductive strip, and between two adjacent longitudinal second conductive strips lies one longitudinal first conductive strip.

Since those having ordinary skill in the art can appreciate the detail and modification of the above embodiment according to the disclosure of the embodiment of FIG. 2, repeated and redundant description is omitted here.

It should be noted that the size (i.e., the length, width, and thickness) of the strip-shaped conductor (e.g., conductive strip or power supply strip) mentioned in the present specification and the variation in the size are not limited to specific specifications and can be determined according to the demand for implementation. Therefore, the strip-shaped conductor may be in the shape of an unconventional/arbitrary strip. It should also be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the finger-type semiconductor capacitor array layout of the present disclosure can mitigate the problem of parasitic capacitance occurring in the prior art, and can prevent the problem caused by the U-shaped structure of the prior art applied in an advanced process.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A finger-type semiconductor capacitor array layout, comprising:
    a first conductive structure including:
        longitudinal first conductive strips located in a first integrated circuit (IC) layer, wherein the longitudinal first conductive strips include M first-row first conductive strips and M second-row first conductive strips, the M first-row first conductive strips are spaced at intervals and thereby form (M-1) first gap(s), the M second-row first conductive strips are spaced at intervals and thereby form (M-1) second gap(s), and the M is an integer greater than one; and
        lateral power supply strips located in a second IC layer, wherein the lateral power supply strips are used for transmission of a first reference voltage and include a first power supply strip and a second power supply strip, the first power supply strip is coupled with the M first-row first conductive strips through M first-row vias respectively, and the second power supply strip is coupled with the M second-row first conductive strips through M second-row vias respectively; and
    a second conductive structure including:
        longitudinal second conductive strips located in the first IC layer, wherein the longitudinal second conductive strips include (M-1) second conductive strip(s), each of the (M-1) second conductive strip(s) includes a first part and a second part that are coupled together, the (M-1) second conductive strip(s) include(s) (M-1) first part(s) and (M-1) second part(s), the (M-1) first part(s) is/are located in the (M-1) first gap(s) and electrically insulated from the M first-row first conductive strips, the (M-1) second part(s) is/are located in the (M-1) second gap(s) and electrically insulated from the M second-row first conductive strips, the (M-1) second conductive strip(s) is/are used for transmission of a second reference voltage that is different from the first reference voltage, the (M-1) second conductive strip(s) include(s) K second conductive strip(s) pertaining to a first capacitor group among P capacitor group(s) of the finger-type semiconductor capacitor array layout, the K is a positive integer not greater than (M-1), and the P is a positive integer; and
        P lateral power supply strip(s) located in the second IC layer or a third IC layer, wherein the P lateral power supply strip(s) include(s) a first-capacitor-group power supply strip that is coupled to the K second conductive strip(s) through K via(s).

2. The finger-type semiconductor capacitor array layout of claim 1, wherein the first capacitor group includes 2K capacitor units.

3. The finger-type semiconductor capacitor array layout of claim 1, wherein a length of each of the (M-1) second conductive strip(s) is longer than a length of each of the M first-row first conductive strips and longer than a length of each of the M second-row first conductive strips.

4. The finger-type semiconductor capacitor array layout of claim 3, wherein the length of each of the (M-1) second conductive strip(s) is longer than two times the length of each of the M first-row first conductive strips and longer than two times the length of each of the M second-row first conductive strips.

5. The finger-type semiconductor capacitor array layout of claim 1, wherein the M is greater than two, the K is a positive integer not greater than (M-2), the P is greater than one, the (M-1) second conductive strips include L second conductive strip(s) pertaining to a second capacitor group among the P capacitor groups, the P lateral power supply strips include a second-capacitor-group power supply strip, the second-capacitor-group power supply strip is coupled to the L second conductive strip(s) through L via(s), and the L is a positive integer not greater than (M-1-K).

6. The finger-type semiconductor capacitor array layout of claim 5, wherein the M is greater than three, the K is not equal to the L, the first capacitor group includes 2K capacitor units, and the second capacitor group includes 2 L capacitor units.

7. The finger-type semiconductor capacitor array layout of claim 1, wherein both the first IC layer and the second IC layer are metal layers, or both the first IC layer and the third IC layer are metal layers.

8. The finger-type semiconductor capacitor array layout of claim 1, wherein the first IC layer and the second IC layer are a first metal layer and a second metal layer respectively, and no other metal layer is between the first metal layer and the second metal layer.

9. The finger-type semiconductor capacitor array layout of claim 1, wherein the longitudinal first conductive strips are parallel in a first direction, the lateral power supply strips are parallel in a second direction, the longitudinal second conductive strips are parallel in the first direction, and the first direction is perpendicular to the second direction.

10. The finger-type semiconductor capacitor array layout of claim 9, wherein the P is greater than one, and the P lateral power supply strips are parallel in the second direction.

11. The finger-type semiconductor capacitor array layout of claim 9, wherein the longitudinal first conductive strips and the longitudinal second conductive strips are located in a layout region, the layout region is in the first IC layer, and no conductive strip in the layout region is disposed in the second direction.

12. The finger-type semiconductor capacitor array layout of claim 1, wherein the finger-type semiconductor capacitor array layout conforms to a Fin Field-Effect Transistor (Fin-FET) process specification.

13. A finger-type semiconductor capacitor array layout, comprising:
    a first conductive structure including longitudinal first conductive strips and lateral power supply strips, wherein the longitudinal first conductive strips are located in a first integrated circuit (IC) layer and include first-row conductive strips and second-row conductive strips, the lateral power supply strips are located in a second IC layer and include a first power supply strip and a second power supply strip; and a second conductive structure including longitudinal second conductive strips and P lateral power supply strip(s), wherein the longitudinal second conductive strips are located in the first IC layer, the P lateral power supply strip(s) is/are located in the second IC layer or a third IC layer, and the P is a positive integer, wherein the longitudinal first conductive strips and the longitudinal second conductive strips are alternately disposed in the first IC layer; the first power supply strip is coupled to the first-row conductive strips through first vias respectively; the second power supply strip is coupled to the second-row conductive strips through second vias respectively; the P lateral power supply strip(s) include(s) a first-capacitor-group power supply strip that is coupled to K second conductive strip(s) of the longitudinal second conductive strips through K third via(s), and the K is a positive integer.

14. The finger-type semiconductor capacitor array layout of claim 13, wherein a length of each of the longitudinal second conductive strips is longer than a length of each of the first-row conductive strips and longer than a length of each of the second-row conductive strips.

15. The finger-type semiconductor capacitor array layout of claim 13, wherein the P is greater than one, the P lateral power supply strips further include a second-capacitor-group power supply strip that is coupled to L longitudinal second conductive strip(s) of the longitudinal second conductive strips through L fourth via(s), the L is a positive integer, a number of the longitudinal second conductive strips is greater than two, and the L is different from the K.

* * * * *